United States Patent
Sun et al.

(10) Patent No.: US 11,069,554 B1
(45) Date of Patent: Jul. 20, 2021

(54) CARBON NANOTUBE ELECTROSTATIC CHUCK

(71) Applicant: Applied Materials, Inc., Santa Clara, CA (US)

(72) Inventors: Dawei Sun, Lynnfield, MA (US); Steven M. Anella, Newbury, MA (US); Qin Chen, Gloucester, MA (US); Ron Serisky, Gloucester, MA (US); Julian G. Blake, Gloucester, MA (US); David J. Chipman, Lynn, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/749,336

(22) Filed: Jan. 22, 2020

(51) Int. Cl.
*H01L 21/683* (2006.01)
*H01T 23/00* (2006.01)
*B23Q 3/154* (2006.01)

(52) U.S. Cl.
CPC .......... *H01L 21/6833* (2013.01); *B23Q 3/154* (2013.01)

(58) Field of Classification Search
CPC .... H01L 21/6833; H01L 21/687; B23Q 3/154
USPC .................................. 361/232, 234
See application file for complete search history.

(56) References Cited

U.S. PATENT DOCUMENTS

| | | | |
|---|---|---|---|
| 8,416,555 B2 * | 4/2013 | Lu ..................... | H01L 21/6833 361/234 |
| 8,792,085 B2 * | 7/2014 | Puyt .................. | H01L 21/68757 355/72 |
| 2008/0001306 A1 | 1/2008 | Basavanhally et al. | |
| 2014/0204501 A1 | 7/2014 | Moriya et al. | |
| 2015/0214132 A1 * | 7/2015 | Lee ..................... | H01L 23/3677 165/185 |
| 2015/0294891 A1 | 10/2015 | Lin et al. | |
| 2019/0027395 A1 | 1/2019 | Masuda et al. | |

FOREIGN PATENT DOCUMENTS

| | | |
|---|---|---|
| JP | 2014-138164 A | 7/2017 |
| JP | 2017-126696 A | 7/2017 |
| KR | 20090115310 * | 2/2014 |
| KR | 10-2014-0032565 A | 3/2014 |

OTHER PUBLICATIONS

International Search Report and Written Opinion dated Apr. 15, 2021 in corresponding PCT application No. PCT/US2020/066348.

* cited by examiner

*Primary Examiner* — Jared Fureman
*Assistant Examiner* — Lucy M Thomas
(74) *Attorney, Agent, or Firm* — Nields, Lemack & Frame, LLC

(57) ABSTRACT

A platen having improved thermal conductivity and reduced friction is disclosed. In one embodiment, vertically aligned carbon nanotubes are grown on the top surface of the platen. The carbon nanotubes have excellent thermal conductivity, thus improving the transfer of heat between the platen and the workpiece. Furthermore, the friction between the carbon nanotubes and the workpiece is much lower than that with conventional embossments, reducing particle generation. In another embodiment, a support plate is disposed on the platen, wherein the carbon nanotubes are disposed on the top surface of the support plate.

10 Claims, 5 Drawing Sheets

CARBON NANOTUBE ELECTROSTATIC CHUCK

FIELD

Embodiments of the present disclosure relate to an electrostatic chuck for semiconductor processing and more particularly, an electrostatic chuck with carbon nanotubes.

BACKGROUND

The fabrication of a semiconductor device involves a plurality of discrete and complex processes. In certain embodiments, a workpiece, such as a silicon substrate, may be disposed on a platen when these processes are performed. The platen may include an electrostatic chuck, which clamps the workpiece to the platen using electrostatic forces.

Additionally, in certain embodiments, it may be advantageous to allow heat to pass from the platen to the workpiece, and vice versa. To improve the heat transfer characteristics, a backside gas may be injected into the volume between the top surface of the platen and the bottom surface of the workpiece. The molecules in the backside gas help conduct heat between the workpiece and the platen. This backside gas may be injected at a pressure of less than 15 torr and have a thermal conductance of between 50 and 800 $W/m^2$-K. However, this may be less than optimal for very high thermal loads and in applications where very high temperature uniformity of the workpiece is needed.

Further, to create this volume, embossments are typically disposed on the top surface of the platen. These embossments are typically constructed of the same material as the top surface of the platen. As the workpiece is placed on and removed from the platen, there may be relative motion between these components. Consequently, in certain embodiments, friction between the bottom surface of the workpiece and the platen may generate particles. This may result in device performance or yield issues.

Therefore, it would be advantageous if there were a platen that had improved heat transfer characteristics as compared to conventional systems. Furthermore, it would be beneficial if this platen also reduced the friction between the platen and the workpiece to minimize particle generation.

SUMMARY

A platen having improved thermal conductivity and reduced friction is disclosed. In one embodiment, vertically aligned carbon nanotubes are grown on the top surface of the platen. The carbon nanotubes have excellent thermal conductivity, thus improving the transfer of heat between the platen and the workpiece. Furthermore, the friction between the carbon nanotubes and the workpiece is much lower than that with conventional embossments, reducing particle generation. In another embodiment, a support plate is disposed on the platen, wherein the carbon nanotubes are disposed on the top surface of the support plate.

According to one embodiment, a platen is disclosed. The platen comprises a dielectric layer; a base; one or more electrodes disposed between the dielectric layer and the base; and a plurality of vertically aligned carbon nanotubes disposed on a top surface of the dielectric layer. In certain embodiments, the plurality of vertically aligned carbon nanotubes are arranged in a plurality of islands. In some embodiments, the number density in each island is between $10^7$ and $10^{11}$ nanotubes/$cm^2$. In certain embodiments, a height of the plurality of vertically aligned carbon nanotubes is between 1 and 500 µm. In certain embodiments, the platen comprises lift pins extending out from the top surface of the dielectric layer. In some embodiments, the platen comprises openings on the top surface of the dielectric layer to accommodate the lift pins. In certain embodiments, all of the openings on the top surface are used for the lift pins or ground pins.

According to another embodiment, assembly for holding a workpiece is disclosed. The assembly comprises an electrostatic chuck; and a support plate disposed on a top surface of the electrostatic chuck, comprising a plurality of vertically aligned carbon nanotubes disposed on a top surface of the support plate. In certain embodiments, the electrostatic chuck comprises lift pins operable to extend outward from the top surface of the electrostatic chuck, and wherein the support plate comprises openings to allow the lift pins to pass through. In certain embodiments, all of the openings in the support plate are used for the lift pins and ground pins. In some embodiments, the support plate comprises a dielectric material. In certain embodiments, the plurality of vertically aligned carbon nanotubes are arranged in a plurality of islands. In some embodiments, wherein the number density in each island is between $10^7$ and $10^{11}$ nanotubes/$cm^2$. In certain embodiments, the height of the plurality of vertically aligned carbon nanotubes is between 1 and 500 µm.

According to another embodiment, an electrostatic chuck is disclosed. In this embodiment, heat is transferred between the electrostatic chuck and a workpiece disposed on the electrostatic chuck by vertically aligned carbon nanotubes disposed on a top surface of the electrostatic chuck. In some embodiments, the vertically aligned carbon nanotubes are arranged in a plurality of islands. In some embodiments, wherein the number density in each island is between $10^7$ and $10^{11}$ nanotubes/$cm^2$. In certain embodiments, the height of the vertically aligned carbon nanotubes is between 1 and 500 µm. In some embodiments, the carbon nanotubes prevent the workpiece from contacting the top surface of the electrostatic chuck.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
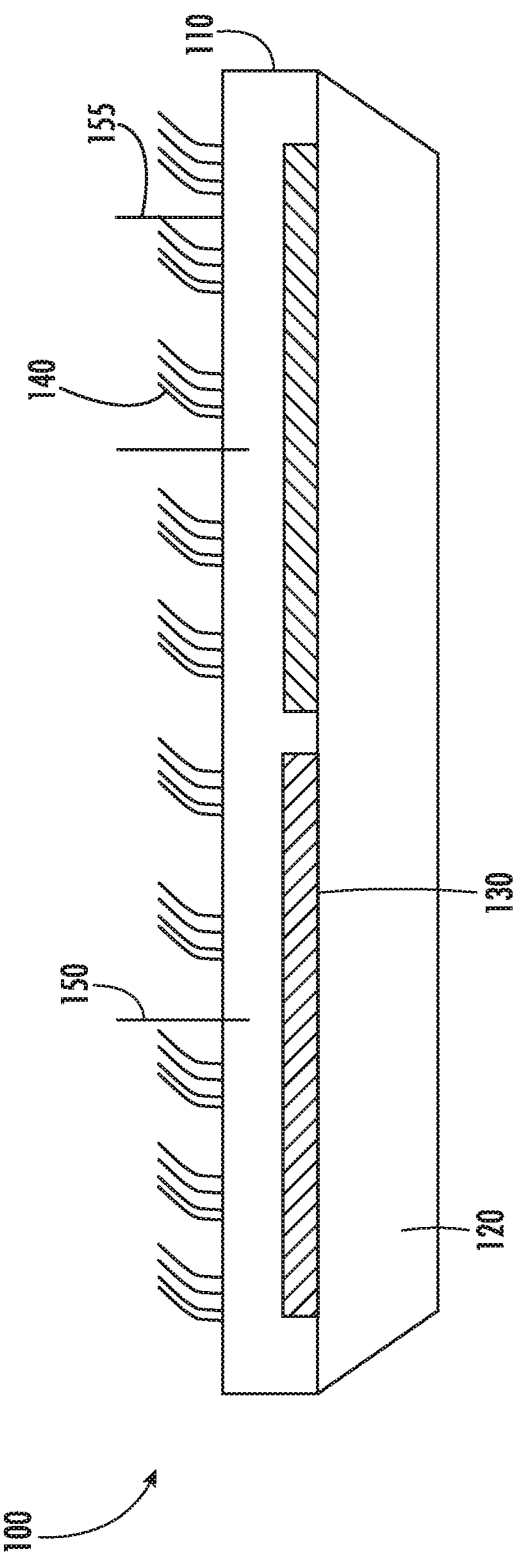
FIG. 1 shows a cross-sectional view of a platen with vertically aligned carbon nanotubes according to one embodiment.
Figure 2:
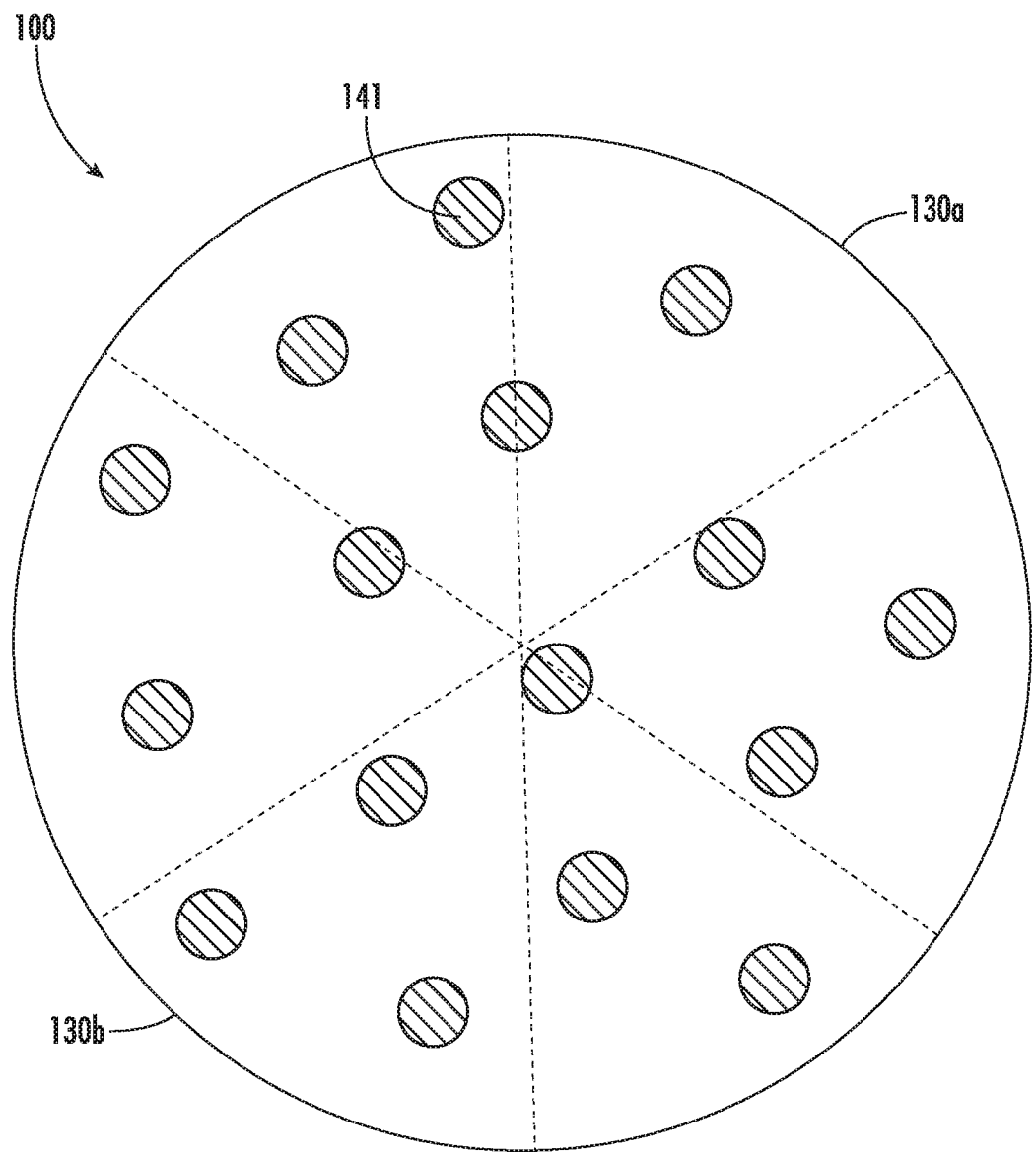
FIG. 2 shows a top view of the platen of FIG. 1.

As described above, in certain embodiments, an improved platen is disclosed. This platen comprises an electrostatic chuck with vertically aligned carbon nanotubes disposed on the top surface of the electrostatic chuck. FIG. 1 shows a cross-sectional view of the platen 100, while FIG. 2 shows a top view of the platen 100.

As seen in FIG. 1, the platen 100 comprises a plurality of layers. The top layer, also referred to as the dielectric layer 110, contacts the workpiece, and is made of an electrically insulating or semiconducting material, such as alumina.

A second layer, also referred to as the base 120, is disposed beneath the dielectric layer 110. To create the electrostatic force, a plurality of electrodes 130 may be disposed between the dielectric layer 110 and the base 120. In another embodiment, the plurality of electrodes 130 may be embedded in the base 120. The plurality of electrodes 130 is constructed from an electrically conductive material, such as metal. The electrodes 130 are used to produce an electrostatic field. Methods of creating this electrostatic field are known to those skilled in the art and will not be described herein.

Typically, the electrodes 130 are electrically isolated from each other. As shown in FIG. 2, these electrodes 130 may be arranged as sectors of a circle, where electrodes that are opposite the center of the platen have opposite voltages. For example, electrode 130a may have a positive voltage while electrode 130b may have a negative voltage. These voltages may be DC, or may vary with time to maintain the electrostatic force. For example, the voltage applied to each electrode 130 may be a bipolar square wave. In certain embodiments, three pairs of electrodes are employed. Each pair of electrodes is in electrical communication with a respective power source, such that one electrode receives the positive output and the other electrode receives the negative output. Each power source may generate the same square wave output, in terms of period and amplitude. However, each square wave may be phase shifted from those adjacent to it. Of course, other numbers of electrodes and alternate geometries may be used.

The voltages applied to the electrodes 130 serve to create an electrostatic force, which clamps the workpiece to the platen 100.

Vertically aligned carbon nanotubes 140 may be disposed on the top surface of the dielectric layer 110, as shown in FIG. 1. These vertically aligned carbon nanotubes may have a height between about 1 and 500 µm. Further, each nanotube may be single-walled or multi-walled.

Additionally, in certain embodiments, these vertically aligned carbon nanotubes 140 may be clustered into islands 141 (see FIG. 2). Each island 141 may have a number density of between $10^7$ and $10^{11}$ nanotubes/cm$^2$. In certain embodiments, the islands 141 may have a diameter of between 0.1 and 5 millimeters and the edge-to-edge spacing between islands 141 may be between 0.1 and 20 millimeters. Islands may be employed to ensure that the electrostatic forces are not grounded by the vertically aligned carbon nanotubes 140. The specific number and location of the islands 141 is an implementation specific decision and is not limited by this disclosure.

To enable the workpiece to be removed from the platen 100, the platen 100 may include mechanically actuated lift pins 150. The lift pins 150 may have a first position, where the lift pins are extended to a height that is less than the height of the vertically aligned carbon nanotubes. In this way, the lift pins 150 do not interfere with the interface between the vertically aligned carbon nanotubes 140 and the workpiece. The lift pins 150 may also have a second position, where the lift pins 150 are extended to a height that is greater than the height of the vertically aligned carbon nanotubes 140. In this way, the lift pins 150 serve to lift the workpiece away from the vertically aligned carbon nanotubes 140.

Thus, in one embodiment, the lift pins are the only openings on top surface of the platen 100.

In some embodiments, ground pins 155 may extend from the top surface of the platen 100. These ground pins 155 are used to electrically ground the workpiece disposed on the platen. In another embodiment, the top surface of the platen 100 may also comprise openings to accommodate ground pins 155. In other words, in certain embodiments, all of the openings on the top surface of the platen 100 are used for the lift pins 150 and the ground pins 155.

In one embodiment, the top surface of the platen 100 is prepared in the following manner. First, a carbon-containing source is catalytically decomposed on small metallic particles or clusters on the platen 100 in those regions where islands 141 are desired. The metals used for these reactions are typically transition elements, such as iron (Fe), cobalt (Co) and nickel (Ni). Next, the platen may be subjected to a catalytic chemical vapor deposition (CCVD) process, where a feedgas comprising a species that includes carbon, such as $CH_4$, $C_2H_2$, $C_2H_4$ or $C_6H_6$, is introduced. This carbon-containing species may be used alone or as part of a mixture with either hydrogen ($H_2$) or argon (Ar). The process typically takes place at temperatures of between 600° C. and 1000° C. The carbon will deposit in these regions where the precursor is disposed. The carbon atoms will then continue to build upon one another, forming carbon nanotubes. The CCVD process is continued until the nanotubes reach the desired height. It is also possible to form the metal particles in situ in the presence of the carbon source, making the aforementioned reaction one-step process. Of course, other techniques may be used to create the vertically aligned carbon nanotubes.

Thus, in this embodiment, the vertically aligned carbon nanotubes 140 are grown directly on the top surface of the dielectric layer 110.

Figure 3:
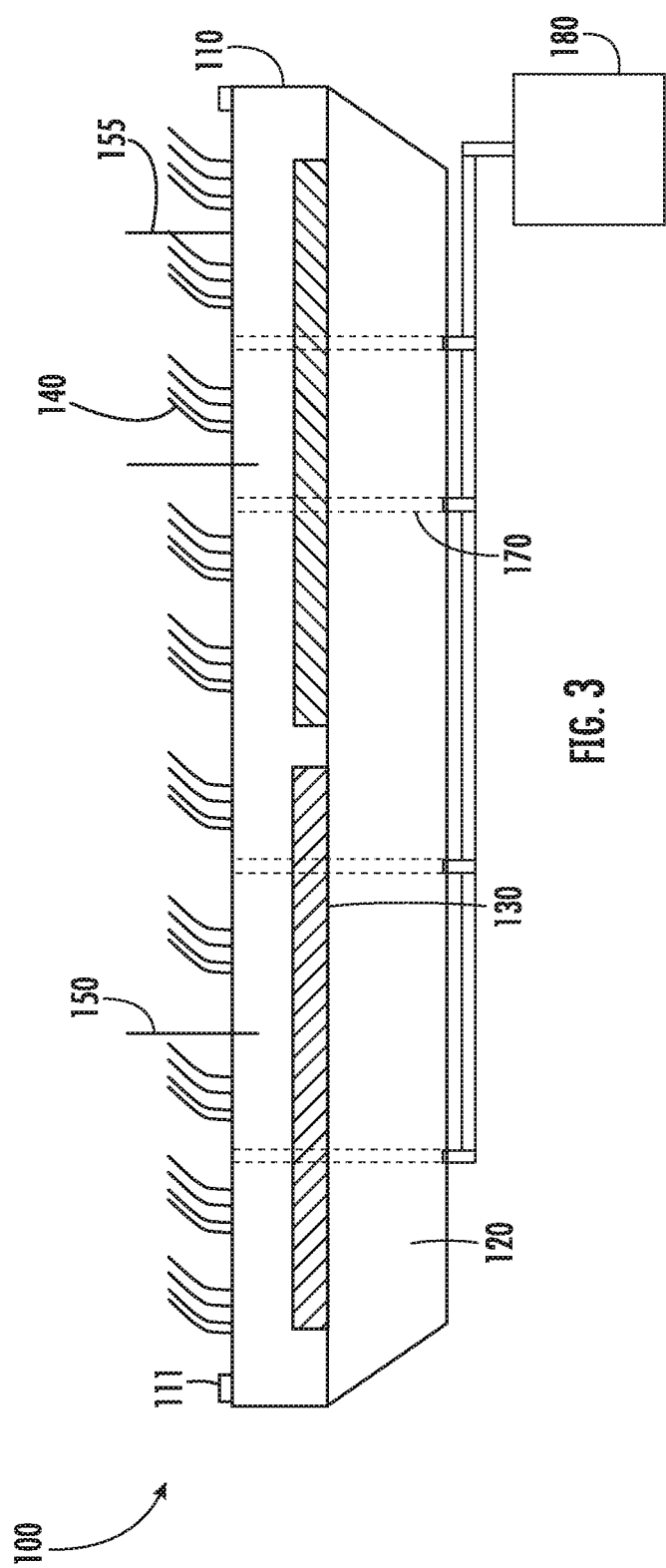
FIG. 3 shows a cross-sectional view of a platen with vertically aligned carbon nanotubes according to another embodiment.

FIG. 3 shows another embodiment, wherein like components have been given identical reference designators. In this embodiment, the platen 100 may include fluid conduits 170 that pass through the platen 100 and exit at the top surface. A backside gas source 180 may be in communication with these fluid conduits 170 to bring backside gas to the top surface of the platen 100. In these embodiments, the top surface of the dielectric layer 110 may include an edge seal 111 near its outer circumference to contain the backside gas within the enclosed volume.

In this embodiment, the openings on the top surface of the platen 100 may be used for lift pins 150, ground pins 155 and the fluid conduits 170.

FIGS. 1-3 show a platen 100 with vertically aligned carbon nanotubes 140 disposed on the top surface of the dielectric layer 110. However, other embodiments are also possible.

Figure 4:
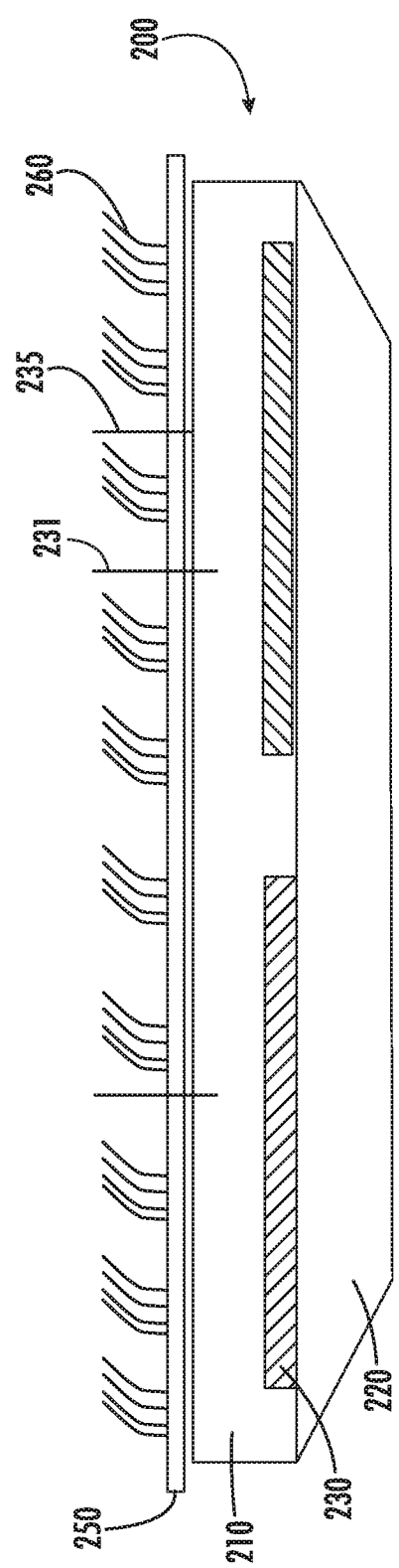
FIG. 4 shows a cross-sectional view of an assembly including a platen and a support plate with vertically aligned carbon nanotubes according to one embodiment.

For example, a support plate 250 may be introduced between the platen 200 and the workpiece, as shown in FIG. 4. FIG. 4 shows an assembly comprising a platen 200. The platen 200 may have a dielectric layer 210, a base 220 and one or more electrodes 230 disposed between the dielectric layer 210 and the base 220. As described above, the electrodes 230 may be in communication with an electrode power supply. Thus, the platen 200 may be a traditional electrostatic chuck. In certain embodiments, the platen 200 may include fluid conduits and a backside gas source, such as that described above with respect to FIG. 3. In other embodiments, the platen 200 does not include fluid conduits or a backside gas source.

A support plate 250 is disposed on top of the platen 200. In certain embodiments, the electrostatic field from the electrodes 130 is used to clamp the support plate 250 to the platen 200. In other embodiments, the support plate 250 may be mechanically clamped to the platen 200, such as through the use of clips or screws. The support plate 250 may be constructed of alumina, aluminum nitride or other dielectric materials.

Figure 5:
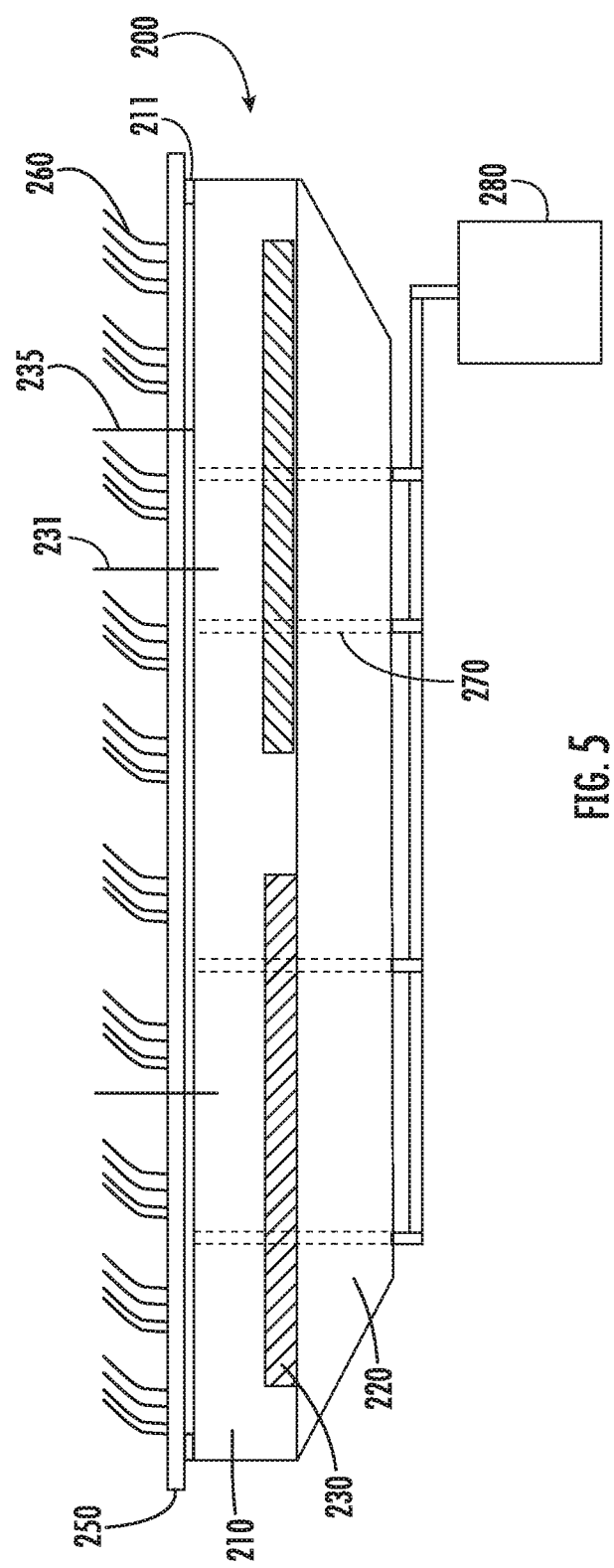
FIG. 5 shows a cross-sectional view of an assembly including a platen and a support plate with vertically aligned carbon nanotubes according to another embodiment.

In certain embodiments, such as that shown in FIG. 5, the platen 200 includes fluid conduits 270. In this embodiment, backside gas from a backside gas source 280 may be introduced into the volume between the top surface of the platen 200 and the bottom surface of the support plate 250 to maximize heat transfer between these components. In this embodiment, the top surface of the dielectric layer 210 may include an edge seal 211 near its outer circumference to contain the backside gas within the enclosed volume between the support plate 250 and the platen 200.

In both embodiments, the vertically aligned carbon nanotubes 260 are grown on the top surface of the support plate 250. The nanotubes may be grown using the technique described above or another suitable process. In certain embodiments, a plurality of islands, such as those described above, may be created on the top surface of the support plate 250. Specifically, each island may have a number density of between $10^7$ and $10^{11}$ nanotubes/cm$^2$. In certain embodiments, the islands may have a diameter of between 0.1 and 5 millimeters and the edge-to-edge spacing between islands 141 may be between 0.1 and 20 millimeters. The specific number and location of the islands is an implementation specific decision and is not limited by this disclosure.

As described above, the vertically aligned carbon nanotubes 260 may have a height of between about 1 and 500 µm. Further, each nanotube may be single-walled or multi-walled. Each island may have a number density of between $10^7$ and $10^{11}$ nanotubes/cm$^2$. Islands may be employed to ensure that the electrostatic forces are not grounded by the vertically aligned carbon nanotubes. The specific number and location of the islands is an implementation detail and is not limited by this disclosure.

In some embodiments, the support plate 250 comprises a plurality of holes to allow the lift pins 231 from the platen 200 to extend through the support plate 250 toward the workpiece. In certain embodiments, all of the holes in the support plate 250 are used for the lift pins 231. In other words, the backside gas is contained within the volume between the support plate 250 and the platen 200.

In some embodiments, ground pins 235 may extend from the top surface of the platen 200 and through the support plate 250. These ground pins 235 are used to electrically ground the workpiece disposed on the support plate 250. In this embodiment, the support plate 250 may also comprise openings to accommodate ground pins 235, which are aligned with these openings. In other words, in certain embodiments, all of the openings in the support plate 250 are used for the lift pins 231 and the ground pins 235.

In other embodiments, additional holes may be disposed in the support plate 250. These additional holes may be aligned with the fluid conduits 270 in the platen 200 that carry the backside gas. In this way, if desired, backside gas may be introduced into the volume between the top surface of the support plate 250 and the bottom of the workpiece.

The present system has many advantages. These advantages are both mechanical and thermal in nature.

With respect to the mechanical advantages, the vertically aligned carbon nanotubes are flexible, and easily bend elastically. Consequently, the friction between the carbon nanotubes and the workpiece may be much lower than is currently experienced between the workpiece and the embossments on the top surface of the platen. This, in turn, may result in the generation of fewer particles. Further, any particles that are generated would be carbon molecules, which are typically not deleterious.

In certain embodiments, the workpiece may be contact the top surface of the platen. Rather, the vertically aligned carbon nanotubes may physically separate the workpiece form the top surface of the platen, further reducing the risk of particle generation.

With respect to thermal advantages, it is known that carbon nanotubes have excellent thermal conductivity. For example, in one test, it was found that the difference between the temperature of the workpiece and the temperature of the surface with the carbon nanotubes was less than 5° C. In other words, as an example, if the support plate 250 of FIG. 3 was at a particular temperature, the workpiece may be less than 5° C. greater than this temperature.

This thermal performance was achieved without the use of backside gas. Thus, in certain embodiments, the platen may be that shown in FIG. 1 which does not contain channels that allow for the passage of backside gas. Thus, the only openings on the surface of the platen may be those used for the lift pins. This may simplify the design and manufacture of the platen. Further, overall cost may also be reduced, since the backside gas source and the conduits between the backside gas source and the platen can be eliminated.

This thermal performance was also realized using a support plate, as shown in FIG. 4. Again, in some embodiments, there is no backside gas in the volume between the support plate 250 and the workpiece. Yet, the temperature of the workpiece is within 5° C. of the support plate 250.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A platen comprising:
   a dielectric layer having openings on a top surface, wherein all openings are used for lift pins and/or ground pins;
   a base;
   one or more electrodes disposed between the dielectric layer and a top surface of the base or embedded in the base; and
   a plurality of vertically aligned carbon nanotubes disposed on the top surface of the dielectric layer, wherein a height of the plurality of vertically aligned carbon nanotubes is between 1 and 500 µm and wherein the vertically aligned carbon nanotubes transfer heat between the platen and a workpiece disposed on the platen.

2. The platen of claim 1, wherein the plurality of vertically aligned nanotubes are arranged in a plurality of islands.

3. The platen of claim 2, wherein the number density in each island is between $10^7$ and $10^{11}$ nanotubes/cm$^2$.

4. The platen of claim 1, further comprising lift pins extending out from the top surface of the dielectric layer.

5. The platen of claim 4, wherein the openings on the top surface of the dielectric layer accommodate the lift pins.

6. The platen of claim 1, wherein the carbon nanotubes prevent the workpiece from contacting the top surface of the electrostatic chuck.

7. An assembly for holding a workpiece, comprising:
   an electrostatic chuck; and
   a support plate, separate from the electrostatic chuck and disposed on a top surface of the electrostatic chuck, comprising a dielectric material and a plurality of vertically aligned carbon nanotubes disposed on a top surface of the support plate, wherein a height of the plurality of vertically aligned carbon nanotubes is between 1 and 500 pm;
   wherein the electrostatic chuck comprises lift pins operable to extend outward from the top surface of the electrostatic chuck, and wherein the support plate comprises openings to allow the lift pins to pass through.

8. The assembly of claim 7, wherein all of the openings in the support plate are used for the lift pins and ground pins.

9. The assembly of claim 7, wherein the plurality of vertically aligned nanotubes are arranged in a plurality of islands.

10. The assembly of claim 9, wherein the number density in each island is between $10^7$ and $10^{11}$ nanotubes/cm$^2$.

\* \* \* \* \*